United States Patent [19]

Stokes et al.

[11] Patent Number: 4,499,393

[45] Date of Patent: Feb. 12, 1985

[54] SURFACE ACOUSTIC WAVE SPECTRUM ANALYZER

[75] Inventors: Robert B. Stokes, Torrance; Kuo-Hsiung Yen, Manhattan Beach; Kei-Fung Lau, Harbor City; Reynold S. Kagiwada, Los Angeles; Michael J. Delaney, Lomita, all of Calif.

[73] Assignee: TRW Inc., Redondo Beach, Calif.

[21] Appl. No.: 580,575

[22] Filed: Feb. 15, 1984

[51] Int. Cl.³ .................. H03H 9/25; H01L 41/08
[52] U.S. Cl. ..................... 310/313 A; 310/313 R; 333/154; 333/196
[58] Field of Search ........... 310/313 B, 313 A, 313 R; 333/154, 150, 154, 193, 196; 324/77 B, 77 D

[56] References Cited

U.S. PATENT DOCUMENTS 3,453,242  6/1984  Toda .................................. 310/328
3,735,256  5/1973  Archer et al. ..................... 324/77 D
4,328,497  5/1982  Vale ................................. 324/77 B

OTHER PUBLICATIONS

Cauvard, P. et al., "Ultrasound Beam Scanning Driven by SAWS" 1978 Ultrasonics Symposium Proceedings, IEEE Cat. 78CH 1344-1SU, pp. 269-272.
Hartemann, P., "Frequency Scanning of Surface Acoustic Wave" Electronics Letters, May 31 '73, vol. 9, No. 11, pp. 246-247.
De La Rue, R. M. et al., "Frequency-Controlled Beam Steering of SAWS", Electronics Letters, July 26 '73, vol. 9, No. 15, pp. 326-327.
Tsai, C. S. et al., "Scanning of SAW Phased Array", Proceedings of the IEEE, Jun. '74, pp. 863-864.
Hartemann, P., et al. "Wavefront Synthesis and Reconstruction Using SAWS", 1977 Ultrasonic Symposium Proceedings, IEEE cat. 77CH1264-1SU, pp. 840-842.

Primary Examiner—J. D. Miller
Assistant Examiner—D. L. Rebsch
Attorney, Agent, or Firm—Noel F. Heal; Donald R. Nyhagen; Robert M. Wallace

[57] ABSTRACT

A surface acoustic wave (SAW) device configured to operate as a spectrum analyzer, and having an array of input transducers disposed on a substrate in such positions as to produce a focused beam of acoustic energy at a focal arc, each position on the arc being representative of an input signal frequency. Output transducers produce electrical signals corresponding to the energy received at successive segments of the focal arc. The disclosed device includes various combinations of input transducer array improvements, some of which are to provide amplitude weighting of the input array, including aperture width weighting, capacitive weighting, resistive weighting, series-parallel weighting, and source withdrawal weighting. Another improvement in input array configuration eliminates close or overlapping electrodes of opposite polarities and thereby reduces parasitic capacitance and acoustic radiation between electrode elements. The use of curved input transducer fingers improves operation of the transducers as point sources. Other important improvements include the use of acoustic transducers before to transmit the focused output energy from the focal line to conventional output transducers, thereby improving frequency resolution, and the use of electromagnetic waveguides to transmit energy from output transducers located on the focal line.

41 Claims, 17 Drawing Figures

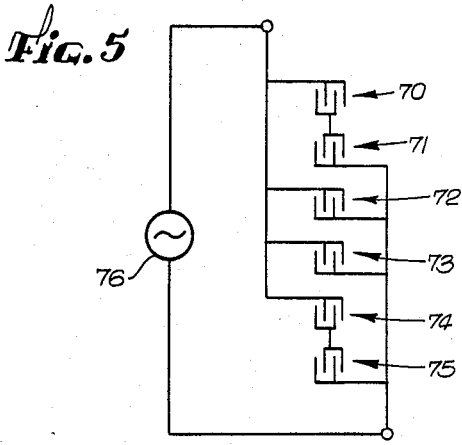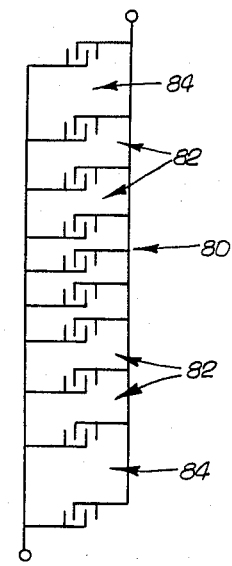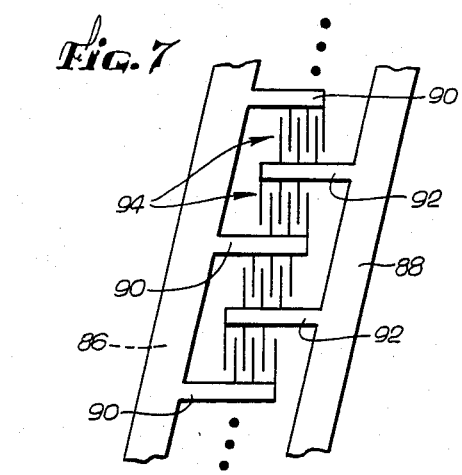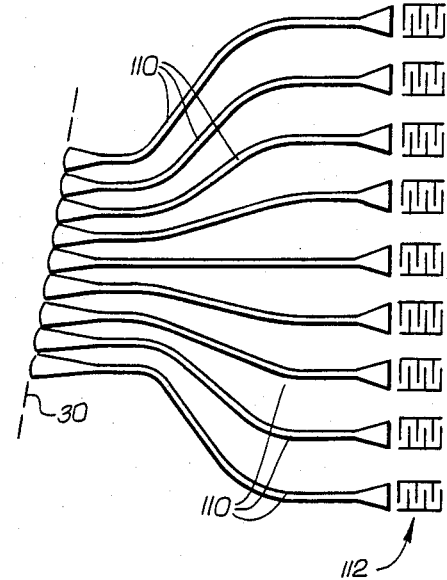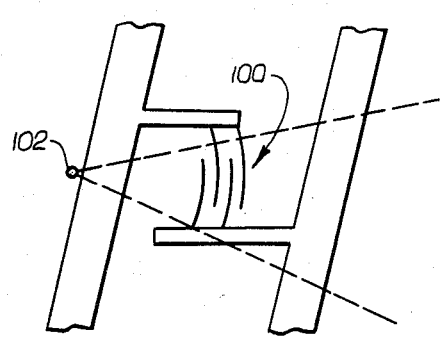

SURFACE ACOUSTIC WAVE SPECTRUM ANALYZER

BACKGROUND OF THE INVENTION

This invention relates generally to surface acoustic wave (SAW) devices, and more particularly, to spectrum analyzers implemented in SAW technology. By way of brief background, SAW devices employ substrates of a piezoelectric material, across which elastic surface waves are propagated between sets of electroacoustic transducers disposed on the substrate surface. The devices employ so-called Rayleigh waves, which can be propagated along a free surface of a solid, and have an amplitude of displacement that is largest right at the substrate surface. In a piezoelectric material, deformations produced by such waves induce local electric fields, which are propagated with the acoustic waves and extend into space above the surface of the material. These electric fields will interact with electrodes disposed on the surface of the material, to serve as electrical input and output transducers for the surface acoustic wave device.

Although most SAW devices are "in-line" devices employing a single propagation direction, SAW technology can also be applied to diffraction-effect devices, such as spectrum analyzers. A SAW spectrum analyzer is disclosed in a copending application of Robert E. Brooks, Ser. No. 529,066, filed on Sept. 2, 1983, and entitled "Signal Processing System and Method." The Brooks application describes the basis on which a SAW spectrum analyzer operates. In essence, the principle of operation is closely analogous to that of an optical diffraction grating. When a collimated beam of light is incident on a plane grating, the scattered light is dispersed into monochromatic waves propagating at angles dependent on their wavelength. If the scattered waves are imaged to points or lines by a focusing lens, a number of diffraction orders will be seen. In each order except the zero order, the light is dispersed into its spectral components. This basic property is used in the optical spectrograph, in which the grating is curved to eliminate the need for a focusing lens, and is "blazed" to provide a multiplicity of reflective scattering strips. By this means, the grating scatters light only in a single diffraction order, and no energy is lost to the unused orders.

The SAW counterpart of the optical spectrograph is closely analogous to a curved and blazed diffraction grating. As in the optical spectrograph, the device is constructed so that almost all of the energy is confined to the first order. Basically, the SAW device comprises a curved input transducer array having a large number of wideband interdigital transducers connected in parallel, and an array of output transducers. Each input transducer is so small that it behaves very much like a point source of energy, which can be considered to radiate circular wavefronts if the anisotropic nature of most SAW substrate materials is neglected.

The curvature of the input transducer array causes the energy from the array to focus at a focal point located at a predetermined focal distance from the array. At the focal point, wavefronts from all of the input transducers arrive simultaneously and reinforce each other. The zero-order focal point is, therefore, at the center of curvature of the array, and each wavefront arriving at the focal point has traversed the same distance from an input transducer. A first-order focal point is laterally spaced from the zero-order focal point. Waves from two adjacent transducers still arrive at the first-order focal point in phase with each other, but their path lengths differ by one wavelength, or some other integral number of wavelengths. Now, if the frequency of the signal applied to the input array is changed, the first-order focal point is shifted laterally with respect to the zero-order focal point. If a wideband input signal is applied to the input array, the first-order focal point becomes a focal arc, each point on the arc representing a different input frequency. The output transducers are arrayed along the focal arc, and each is responsive to a narrow band of frequencies. This, then, is the basis for spectral analysis using SAW techniques.

Although the aforementioned copending application discloses a device of this kind that is generally satisfactory in most respects, there is still need for further improvement in the areas of frequency resolution and suppression of electromagnetic feedthrough. The present invention is directed to this need.

SUMMARY OF THE INVENTION

The present invention resides in an improved SAW spectrum analyzer that provides higher dynamic range, finer frequency resolution, and better electromagnetic feedthrough suppression, by means of a variety of improvements in input and output transducer structures, which can be implemented in various combinations. Briefly, the spectrum analyzer structure that is common to all aspects of the invention, and to the apparatus disclosed in the previously referenced patent application, includes a piezoelectric substrate, and an input transducer array disposed on the surface of the substrate and having a plurality of individual interdigital transducers spaced onto a curve and connected electrically for the application of input signals. The array of input transducers provides acoustical radiation that is focused along a focal arc, each position on the focal arc being representative of a different frequency component in the input signals. The structure also includes an output transducer array, disposed on the substrate in such positions as to convert acoustical signals received at the focal arc into corresponding electrical output signals representative of relatively narrow frequency bands in the input signals.

In accordance with one aspect of the invention, the input transducer array is amplitude-weighted to improve beam focusing and reduce beam sidelobes, by means of one or more of a number of disclosed techniques. In one technique, the input transducer array is amplitude-weighted by means of series capacitance coupling of the input signals to selected ones of the input transducers. In accordance with another approach, amplitude weighting is effected by selectively coupling the input transducers in series and parallel relationships to vary the amplitude of the resultant acoustic radiation across the array.

Yet another approach is to effect amplitude weighting by selective removal of some of the input transducers from the array. Overlap weighting, wherein the degree of overlap of the fingers in a transducer is selectively varied to control the amplitude of the generated acoustic signal, may be usefully combined with one of the foregoing coarser techniques, such as selective series-parallel connection or transducer source withdrawal. Finally, any of the aforementioned techniques may be usefully combined with resistive weighting, wherein selected ones of the input transducers have the input signals coupled to them through series resistors.

Another aspect of the invention involves a novel input transducer array structure that reduces parasitic capacitance and acoustic radiation between adjacent input transducer elements. In accordance with this aspect of the invention, the input transducers take the form of a pair of generally parallel electrodes, each having a plurality of electrode branches, frequently referred to as sum bars, extending into the area between the electrodes in an interdigitated fashion. Each of the input transducers in the array has interdigital fingers extending from a sum bar of one of the electrodes and a sum bar of the other electrode, and each sum bar, except for end ones in the array, contribute transducer fingers to two adjacent input transducers. One advantage of this approach is that the two electrodes do not have to be placed in such a position that one of them intersects the sum bars of the other. Furthermore, since each sum bar except the end ones contributes electrode fingers to two adjacent transducer cells, the configuration avoids the placement of sum bars from two electrodes in adjacent positions. Finally, the configuration permits the transducers to be arranged in a more closely packed relationship.

In accordance with another important aspect of the invention, the substrate material used in the device is practically isotropic and is of X-propagating lithium niobate produced with a Y-rotated cut at a rotation angle of approximately 121 degrees. It has been found that this particular cut of lithium niobate is a practically isotropic material, having an almost uniform velocity of wave propagation over a wide range of propagation directions, but also having a high coupling coefficient and exhibiting low attenuation losses.

Another aspect of the invention involves the use of curved transducer elements in the input transducers. If the elements are curved along generally concentric arcs, each transducer can better perform as a point source of acoustic radiation. Straight transducer elements are inherently not omnidirectional in nature.

In accordance wth another important aspect of the invention, the output transducer array is not positioned at the focal line of the device. Instead, acoustic waveguides are used to transmit acoustic radiation from the focal line to the output transducers, which can be "fanned out" across the substrate in more convenient positions. This approach increases the frequency resolution of the device, since the output transducers do not have to be crowded along the focal line. To further increase the frequency resolution, there may be multiple transducers at the output end of each acoustic waveguide.

A variation of the acoustic waveguide output approach is to use a dielectric waveguide or a hybrid stripline mounted on the surface of the substrate. Regardless of the type of waveguide used, the output transducers can be of conventional design, since the output from the waveguides will be in the form of practically straight-line wavefronts rather than circular wavefronts.

It will be appreciated from the foregoing that the present invention represents a significant advance in the field of diffraction-effect SAW devices. In particular, the improvements of the invention result in enhanced frequency resolution, reduced crosstalk between adjacent transducer elements of the device, and a higher dynamic range. Other aspects and advantages of the invention will become apparent from the following more detailed description, taken in conjunction with the accompanying drawings.

BRIEF DESCRIPTION OF THE DRAWINGS

FIG. 5 is a fragmentary plan view of an input transducer array that is connected selectively in series and parallel for amplitude weighting;

FIG. 6 is a fragmentary plan view of an input transducer array employing source withdrawal for amplitude weighting;

FIG. 7 is a fragmentary plan view of an input transducer array showing an improved element connection configuration;

FIG. 8 is a fragmentary plan view of an input transducer array having curved transducer elements to enhance its performance as a point source of radiation;

FIG. 9 is a diagrammatic plan view of an output detection array, including a set of output waveguides and a set of conventional interdigital transducers;

DESCRIPTION OF THE PREFERRED EMBODIMENTS

Figure 1:
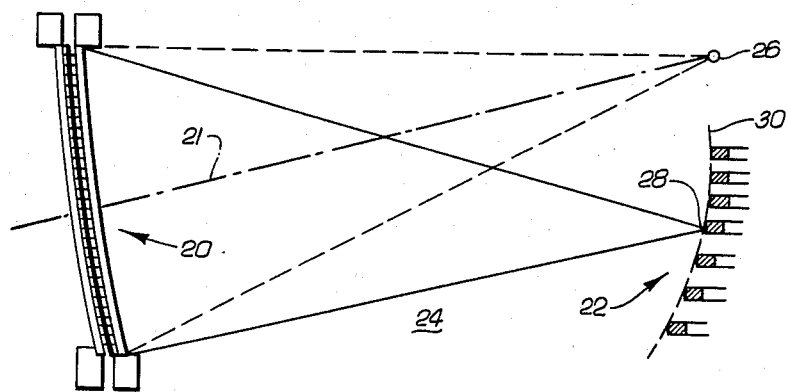
FIG. 1 is a diagrammatic representation, in plan view, of a SAW spectrum analyzer.

As shown in the drawings for purposes of illustration, the present invention is concerned with surface acoustice wave (SAW) devices of the type that are used as diffraction-effect devices. In particular, the invention is concerned with a SAW spectrum analyzer, the function of which is to provide a spectral set of narrowband output signals from a single wideband input signal. The spectrum analyzer comprises an array of input transducers, indicated generally by reference numeral 20, and an array of output transducers 22, both arrays being disposed on the surface of a piezoelectric substrate 24. An electrical input signal having a wide band of frequency components is applied to the input transducer array 20, and the device functions to provide narrowband output signals from the output transducers 22.

The principle of operation of the device is analogous to that of an optical diffraction grating. The input transducer array includes a relatively large number of individual transducers, each of which, at least in theory, functions as a point source of acoustic energy. If the substrate material is isotropic, the point sources of radiation give rise to circular wavefronts emanating from each input transducer. In practice, many SAW substrates are anisotropic, and the wavefront velocity is dependent on the direction of propagation.

The transducers in the input array 20 are positioned on a circular arc having a transverse axis of symmetry 21. The separate wavefronts from all of the transducers will reinforce each other at a zero-order focal point, indicated at 26, which is equidistant from all of the transducers and situated on the axis of symmetry 21. The zero-order focal point will be the same regardless of the frequency of the signals. As in the optical analogy, there are other "diffraction" orders in the SAW device. For any given frequency, there is a first-order focal point, such as is shown at 28, where the acoustic waves from all of the input transducers also combine to reinforce each other, but there is a one-wavelength difference in the path lengths to the focal point from any two adjacent transducers. As the frequency of the input signals changes, the position of this first-order focal point shifts laterally along a focal arc, indicated at 30, laterally spaced from the axis of symmetry 21.

The output transducers 22 are arrayed along the focal arc 30, each having a relatively small aperture and being responsive to only a relatively narrow band of frequencies. In this manner, the SAW spectrum analyzer operates to provide a spectral set of narrowband output signals from a single wideband input signal. Unfortunately, the device as described with reference to FIG. 1 suffers from a few significant disadvantages, such as lack of good frequency resolution. Also, devices constructed prior to this invention had to use anisotropic substrate materials for high frequency operation, and this required the use of cumbersome techniques to compensate for the differences in propagation velocity.

In accordance with the invention, the basic device illustrated in FIG. 1 is provided with a number of related improvements in the arrangement of its input transducers and its output transducers. In addition, a preferred form of the device employs an isotropic form of lithium niobate as the substrate.

The isotropic substrate preferred in the structure of the invention is X-propagating, rotated Y-cut lithium niobate ($LiNbO_3$), in which the Y-rotation angle is 121 degrees. It has been found that this particular cut provides a practically zero coefficient of anisotropy. In other words, the velocity of propagation is almost independent of direction, at least over a practical range of propagation directions. Moreover, the substrate still provides a desirably high coupling coefficient and relatively low attenuation losses.

Figure 2:
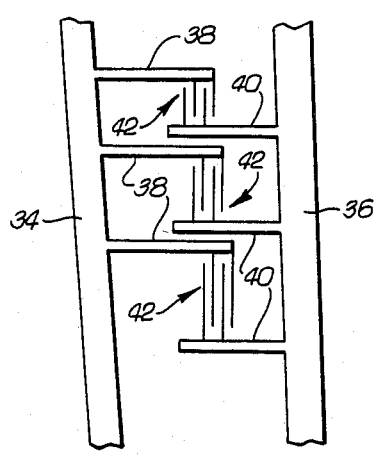
FIG. 2 is a fragmentary plan view of an input transducer array that is amplitude weighted by aperture width weighting.

The improvements to the input transducer array 20 are shown in FIGS. 2–8. FIG. 2 shows how the input transducer array 20 is amplitude-weighted by varying the width of each transducer. The transducer structure illustrated includes two electrodes 34 and 36 arranged in an approximately parallel relationship and having sum bars 38 and 40 extending toward each other in an overlapping relationship, referred to as an interdigital relationship. Extending from each of the sum bars are transducer elements or fingers 42. These are also arranged in an interdigital relationship. Each interdigital set of fingers 42 constitutes a transducer cell, and it will be seen that the three cells shown have different apertures or widths, i.e. the transducer fingers overlap by different amounts. This provides a continuously variable control over the transducer cell amplitude, so that the array 20 may be amplitude weighted in any desired manner to minimize sidelobes from the acoustic beam emanating from the array.

Figure 3:
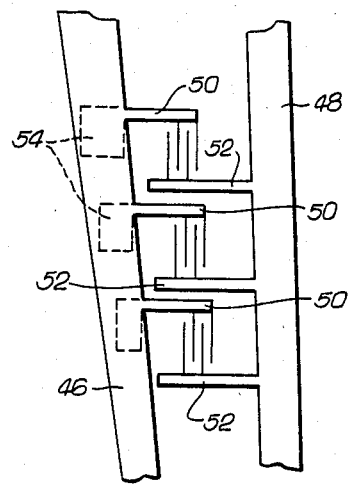
FIG. 3 is a fragmentary plan view of an input transducer array that is amplitude weighted by capacitive weighting.

FIG. 3 shows another type of amplitude weighting, employing series capacitance elements. By way of example, two electrodes 46 and 48 are shown as substantially parallel. As in the previously described array, each electrode has sum bars 50 and 52 that are interdigital in form, but the sum bars 50 do not connect directly with the main electrode 46. Instead, they terminate in enlarged pads 54 beneath the electrode 46, and are separated therefrom by a dielectric layer, such as silicon dioxide ($SiO_2$), which is not shown in FIG. 3. Thus, each of the sum bars 50 includes a series-connected capacitance, formed by one of the pads 54 and the electrode 46. This form of amplitude weighting is, however, not suitable for higher frequencies of operation, because the weighting accuracy is critically dependent on the alignment of multiple masks, and on the quality of the dielectric layer 46.

Figure 4:
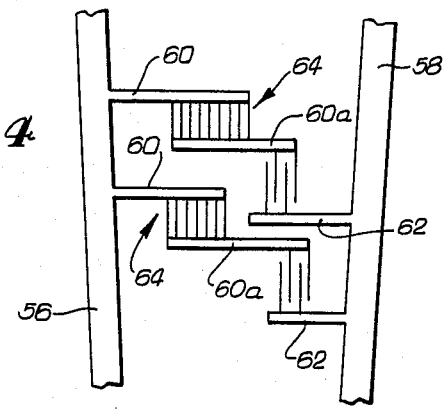
FIG. 4 is a fragmentary plan view of an input transducer array that is amplitude weighted by resistive weighting.

FIG. 4 illustrates a form of resistive weighting for the same general purpose. Again, there are two substantially parallel electrodes 56 and 58, each of which has sum bars 60 and 62. However, the sum bars 60 do not overlap the sum bars 62. Instead, they overlap subsidiary sum bars 60a, which are joined to the main sum bars 60 by relatively thin conductive strips 64. The subsidiary sum bars 60a overlap the opposing sum bars 62, and there are interdigital fingers 66 extending from both the sum bars 62 and the subsidiary sum bars 60a. The conductive strips 64 are used as adjustable resistive elements, and may be trimmed by laser or other methods, for any needed fine-tuning prior to completion of the fabrication process.

FIG. 5 shows another technique for amplitude weighting of the input transducer array 20. Six transducer cells 70–75 are shown by way of example, connected to an input signal source 76. Transducers that are the first two in the array, i.e. those referred to by numerals 70 and 71, are connected in series with the signal source 76. Likewise, the last two transducers 74 and 75 in the array are also connected in series. The two transducers 72 and 73 in the middle of the array are connected in parallel directly to the signal source 76. This provides a coarse form of amplitude weighting, since it will be seen that the amplitude resulting from the middle transducers 72 and 73 will be twice that of the outer transducers 70, 71, 74 and 75.

Another coarse form of amplitude weighting is shown in FIG. 6. Basically, transducers near the center of the array 20 are closely spaced as usual, as indicated at 80, but are spaced less closely toward the ends of the array. Numeral 82 indicates spaces in the array that would normally accommodate one additional transducer, and numeral 84 indicates spaces that would normally accommodate two additional transducers. In practice, these last-described coarse weighting techniques can be best applied in combination with another approach, such as aperture width weighting, for fine-tuning the array to provide a desired output pattern.

In accordance with another aspect of the invention, the input transducer array 20 is modified in the manner shown in FIG. 7. In the array illustrations previously discussed, such as the one shown in FIG. 2, a transducer cell is formed by fingers extending from opposed sum bars, each of which contributes fingers to only one transducer cell. This geometric arrangement results in the side-by-side placement of sum bars or electrode branches of opposite polarities, as is readily apparent from FIG. 2. In the array geometry of FIG. 7, there are two parallel electrodes 86 and 88, having sum bars 90 and 92 extending toward and overlapping each other as before. However, each sum bar contributes transducer fingers 94 in both directions, so that there is only one sum bar separating two adjacent transducer cells. Thus, side-by-side placement of sum bars of opposite polarities is completely avoided. This reduces parasitic capacitance and acoustic radiation between adjacent transducer elements, and allows the transducer cells to be arranged more closely together. Another related aspect of the structure shown in FIG. 7 is in the non-overlapping placement of the electrodes and sum bars. In the device disclosed in the previously referenced copending patent application, transducer cells are formed without side-by-side placement of the the sum bars, but one electrode is placed in overlapping relation with the sum bars of the other electrode, which may pose capacitance problems at higher frequencies. The present structure not only avoids side-by-side placement of sum bars of opposite polarities, but also avoids overlapping of electrode elements of opposite polarities.

In accordance with another improvement concerning the input transducer array 20, and as shown diagrammatically in FIG. 8, the array transducer fingers 100 are made to conform with an arc, centered approximately at the intended point of origin 102 of the acoustic waves generated. Since each input transducer is intended to function as a point source of acoustic energy, the curvature of the transducer fingers more nearly approximates this ideal, since there is clearly a tendency for straight transducer fingers to favor propagation in a direction perpendicular to the fingers. The use of curved input transducer fingers results in reduced off-axis distortion and increased analyzer bandwidth.

One of the difficulties of obtaining fine frequency resolution from a SAW spectrum analyzer is that the output transducers must necessarily have sufficient width to yield a reasonably strong output signal. Their interdigital structure also imposes a lower limit on their size. FIG. 9 illustrates a solution of this difficulty. Instead of arranging the output transducers along the focal arc, the output signals are "fanned out" by waveguides 110, the inputs of which are arrayed along the focal arc of the device. The outputs of the waveguides may be conveniently more widely spaced, allowing ample room for conventional "in-line" interdigital transducers, indicated at 112. As will be further discussed, the waveguides 110 are acoustic waveguides. Electromagnetic waveguides may be employed if output transducers are placed along the focal arc.

Figure 10A:
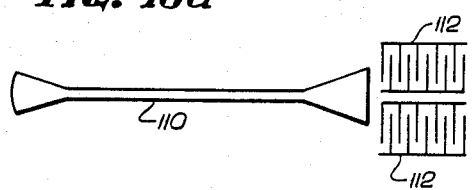
FIGS. 10a–10c are alternative output configurations employing waveguides and multiple transducers at the output ends.
Figure 10B:
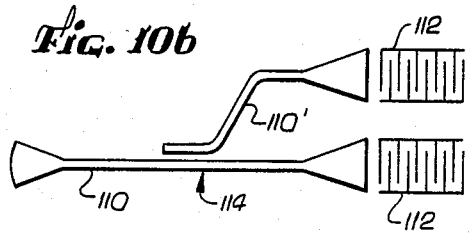
Figure 10C:
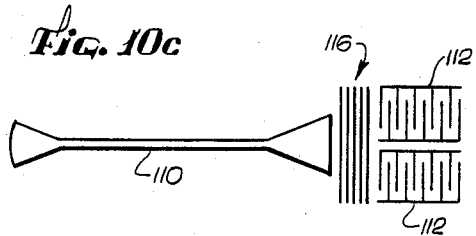

For further improved frequency resolution, multiple output transducers may be positioned at each of the waveguides 110, as shown by way of example in FIGS. 10a–10c. FIG. 10a shows two output transducers 112 positioned at the output of a single waveguide 110. FIG. 10b shows an alternative arrangement in which a waveguide 110 is tapped at an acoustic waveguide coupler 114, forming an additional acoustic waveguide 110' in parallel with the original one. The output transducers 112 are then positioned at the outputs of the waveguides 110 and 110'. In the third arrangement, a multistrip coupler 116 is positioned at the output of the waveguide 110, to provide a wider source of acoustic energy. Two transducers 112 are then placed in the path of acoustic waves emanating from the elements of the multistrip coupler. In all of these cases, the effect is to split the frequency band carried by the waveguide into two narrow and approximately equal portions, thereby further improving the frequency resolution.

Figure 11:
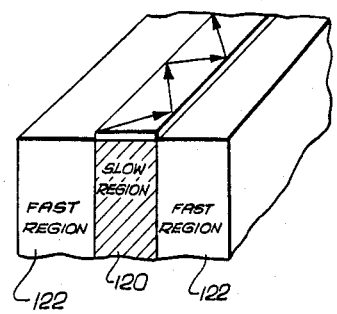
FIG. 11 is a diagrammatic representation of an acoustic waveguide.
Figure 12:
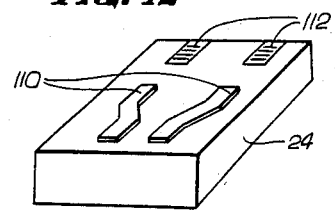
FIG. 12 is a simplified view of an output configuration employing metal or dielectric acoustic waveguides.

FIG. 11 shows in simplified form the structure of an acoustic waveguide. It includes a "slow" region 120, of lower wave velocity, sandwiched between two "fast" regions 122 of higher velocity. Again, there is a close analogy to the optical waveguide, in which light is transmitted along a tube having a cladding of different refractive index. The slow region can take the form of a mass loaded strip, a slot, a shorting strip, an ion implantation region, or a diffusion region in the substrate. By way of further explanation, FIG. 12 shows a simplified output configuration with surface-mounted acoustic waveguides 110, of metal of dielectric material, and two corresponding output transducers. Other types of acoustic waveguides, such as ridges or slots formed on the substrate, may be employed for the same purpose.

Figure 13A:
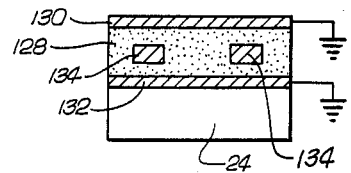
FIGS. 13a and 13b are cross-sectional views of a hybrid stripline structure and a dielectric waveguide for use in output from the device of the invention.
Figure 13B:
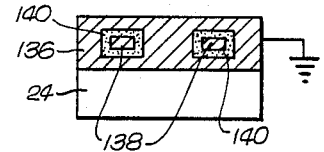

FIGS. 13a and 13b show alternative forms of waveguides used at the output end of the analyzer. FIG. 13a shows a typical cross section of a hybrid stripline structure that can be mounted on the surface of the substrate 24 and used to transmit the energy focused at the focal arc. The stripline structure includes a layer 128 of dielectric material, such as silicon dioxide, sandwiched between two grounded conductive layers 130 and 132, and two conductors 134 buried in the dielectric layer. The structure shown in FIG. 13b includes a single thick layer 136 of grounded metal, with conductive strips 138 buried within the grounded layer but insulated from it by a dielectric cladding 140.

Figure 14:
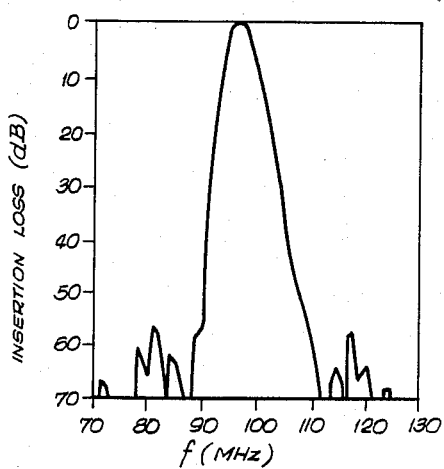
FIG. 14 is a graph showing the center channel frequency response of the spectrum analyzer of the invention, in which the input transducer has been amplitude weighted in accordance with Hamming-function weighting.

FIG. 14 shows the center channel frequency response of the SAW spectrum analyzer of the invention, with the input transducer array 20 amplitude-weighted in accordance with Hamming function weighting. The amplitude weighting results in a first sidelobe that is about 55 dB below the center peak of the response.

It will be appreciated from the foregoing that the present invention represents a significant advance in the field of surface acoustic wave devices. In particular, the invention provides improved frequency resolution, reduction of sidelobes in the focused acoustic beam, and higher dynamic range. It will also be appreciated that, although several embodiments have been described in detail for purposes of illustration, various modifications may be made without departing from the spirit and scope of the invention. Accordingly, the invention is not to be limited except as by the appended claims.

We claim:

1. A surface acoustic wave (SAW) device for use as a spectrum analyzer, said device comprising:

a piezoelectric substrate;

an input transducer array disposed on the surface of said substrate, said array having a plurality of individual interdigital transducers connected electrically for the application of input signals, and spaced along an approximately circular arc having a transverse axis of symmetry, to provide acoustic radiation that is focused onto a focal arc of greater than zero order, laterally spaced from said axis of symmetry, each position on the focal arc being representative of a different frequency component in the input signals; and an output transducer array, disposed on said substrate in such positions as to convert acoustic signals received at the focal arc into corresponding electrical output signals representative of relatively narrow frequency bands in the input signals;

wherein said input transducer array is amplitude-weighted to improve beam focusing and reduce beam sidelobes, and wherein said input transducer array is amplitude-weighted by means including series capacitance coupling of the input signals to selected ones of said input transducers.

2. A surface acoustic wave device as set forth in claim 1, wherein:

said input transducers have interdigital fingers that are curved to improve their ability to function as point sources.

3. A surface acoustic wave device as set forth in claim 1, wherein:

said substrate material is practically isotropic and is of X-propagating lithium niobate produced with a Y-rotated cut at a rotation angle of approximately 121 degrees.

4. A surface acoustic wave (SAW) device for use as a spectrum analyzer, said device comprising:

a piezoelectric substrate;

an input transducer array disposed on the surface of said substrate, said array having a plurality of individual interdigital transducers connected electrically for the application of input signals, and spaced along an approximately circular arc having a transverse axis of symmetry, to provide acoustic radiation that is focused onto a focal arc, each position on the focal arc of greater than zero order, laterally spaced from said axis of symmetry being representative of a different frequency component in the input signals; and an output transducer array, disposed on said substrate in such positions as to convert acoustical signals received at the focal arc into correponding electrical output signals representative of relatively narrow frequency bands in the input signals;

wherein said input transducer array is amplitude-weighted to improve beam focusing and reduce beam sidelobes, and wherein said input transducer array is amplitude-weighted by means including means for selectively coupling said input transducers in series and parallel relationships to vary the amplitude of the resultant acoustic radiation across the array.

5. A surface acoustic wave device as set forth in claim 4, wherein:

said input transducers have interdigital fingers that are curved to improve their ability to function as point sources.

6. A surface acoustic waveguide as set forth in claim 4, wherein:

said substrate material is practically isotropic and is of X-propagating lithium niobate produced with a Y-rotated cut at a rotation angle of approximately 121 degrees.

7. A surface acoustic wave (SAW) device for use as a spectrum analyzer, said device comprising:

a piezoelectric substrate;

an input transducer array disposed on the surface of said substrate, said array having a plurality of individual interdigital transducers connected electrically for the application of input signals, and spaced along an approximately circular arc having a transverse axis of symmetry, to provide acoustic radiation that is focused onto a focal arc of greater than zero order, laterally spaced from said axis of symmetry, each position on the focal arc being representative of a different frequency component in the input signals; and an output transducer array, disposed on said substrate in such positions as to convert acoustic signals received at the focal arc into corresponding electrical output signals representative of relatively narrow frequency bands in the input signals;

wherein said input transducer array is amplitude-weighted to improve beam focusing and reduce beam sidelobes, and wherein said input transducer is amplitude-weighted by selective removal of some of said input transducers from the array.

8. A surface acoustic wave device as set forth in claim 7, wherein:

said input transducers have interdigital fingers that are curved to improve their ability to function as point sources.

9. A surface acoustic waveguide as set forth in claim 7, wherein:

said substrate material is practically isotropic and is of X-propagating lithium niobate produced with a Y-rotated cut at a rotation angle of approximately 121 degrees.

10. A surface acoustic wave device as set forth in claim 4, wherein:

said input transducer array is also amplitude-weighted by means of overlap weighting, wherein the degree of overlap of transducer fingers is selectively varied across the array.

11. A surface acoustic wave device as set forth in claim 10, wherein:

said substrate material is practically isotropic and is of X-propagating lithium niobate produced with a Y-rotated cut at a rotation angle of approximately 121 degrees.

12. A surface acoustic wave device as set forth in claim 7, wherein:

said input transducer array is also amplitude-weighted by means of overlap weighting, wherein the degree of overlap of transducer fingers is selectively varied across the array.

13. A surface acoustic waveguide as set forth in claim 12, wherein:

said substrate material is practically isotropic and is of X-propagating lithium niobate produced with a Y-rotated cut at a rotation angle of approximately 121 degrees.

14. A surface acoustic wave device as set forth in claim 1, wherein:

said input transducer array is also amplitude-weighted by means of resistive weighting, wherein selected ones of said input transducers have the input signals coupled to them through series resistors.

15. A surface acoustic wave device as set forth in claim 14, wherein:

said substrate material is practically isotropic and is of X-propagating lithium niobate produced with a Y-rotated cut at a rotation angle of approximately 121 degrees.

16. A surface acoustic wave device as set forth in claim 4, wherein:

said input transducer array is also amplitude-weighted by means of resistive weighting, wherein selected ones of said input transducers have the input signals coupled to them through series resistors.

17. A surface acoustic wave device as set forth in claim 16, wherein:
said substrate material is practically isotropic and is of X-propagating lithium niobate produced with a Y-rotated cut at a rotation angle of approximately 121 degrees.

18. A surface acoustic wave device as set forth in claim 7, wherein:
said input transducer array is also amplitude-weighted by means of resistive weighting, wherein selected ones of said input transducers have the input signals coupled to them through series resistors.

19. A surface acoustic wave device as set forth in claim 18, wherein:
said substrate material is practically isotropic and is of X-propagating lithium niobate produced with a Y-rotated cut at a rotation angle of approximately 121 degrees.

20. A surface acoustic wave device as set forth in claim 10, wherein:
said input transducer array is also amplitude-weighted by means of resistive weighting, wherein selected ones of said input transducers have the input signals coupled to them through series resistors.

21. A surface acoustic wave device as set forth in claim 20, wherein:
said substrate material is practically isotropic and is of X-propagating lithium niobate produced with a Y-rotated cut at a rotation angle of approximately 121 degrees.

22. A surface acoustic wave device as set forth in claim 12, wherein:
said input transducer array is also amplitude-weighted by means of resistive weighting, wherein selected ones of said input transducers have the input signals coupled to them through series resistors.

23. A surface acoustic wave device as set forth in claim 22, wherein:
said substrate material is practically isotropic and is of X-propagating lithium niobate produced with a Y-rotated cut at a rotation angle of approximately 121 degrees.

24. A surface acoustic wave (SAW) device for use as a spectrum analyzer, said device comprising:
a piezoelectric substrate;
an input transducer array disposed on the surface of said substrate, said array having a plurality of individual interdigital transducers connected electrically in parallel for the application of input signals, and spaced along an approximately circular arc having a transverse axis of symmetry, to provide acoustic radiation that is focused onto a focal arc of greater than zero order, laterally spaced from said axis of symmetry, each position on the focal arc being representative of a different frequency component in the input signals; and
an output transducer array, disposed on said substrate in such positions as to convert acoustical signals received at the focal arc into corresponding electrical output signals representative of relatively narrow frequency bands in the input signals;
wherein said input transducer array is amplitude-weighted to improve beam focusing and reduce beam sidelobes, and wherein said input transducers are formed by a pair of generally parallel electrodes, each having a plurality of sum bars extending between said electrodes in an interdigital fashion, each of said input transducers in said array having interdigitated fingers extending from a sum bar of one of said electrodes and a sum bar of the other electrode, each sum bar except end ones in said array providing transducer fingers for two adjacent ones of said input transducers.

25. A surface acoustic wave device as set forth in claim 24, wherein:
said input transducers have interdigital fingers that are curved to improve their ability to function as point sources.

26. A surface acoustic wave device as set forth in claim 24, wherein:
said substrate material is practically isotropic and is of X-propagating lithium niobate produced with a Y-rotated cut at a rotation angle of approximately 121 degrees.

27. A surface acoustic wave (SAW) device for use as a spectrum analyzer, said device comprising:
a piezoelectric substrate;
an input transducer array disposed on the surface of said substrate, said array having a plurality of individual interdigital transducers connected electrically for the application of input signals, and spaced along an approximately circular arc having a transverse axis of symmetry, to provide acoustic radiation that is focused onto a focal arc of greater than zero order, laterally spaced from said axis of symmetry, each position on the focal arc being representative of a different frequency component in the input signals; and
an output transducer array, disposed on said substrate in such positions as to convert acoustic signals received at the focal arc into corresponding electrical output signals representative of relatively narrow frequency bands in the input signals;
wherein said substrate material is practically isotropic and is of X-propagating lithium niobate produced with a Y-rotated cut at a rotation angle of approximately 121 degrees.

28. A surface acoustic wave device as set forth in claim 27, wherein:
said input transducers have interdigital fingers that are curved to improve their ability to function as point sources.

29. A surface acoustic wave (SAW) device for use as a spectrum analyzer, said device comprising:
a piezoelectric substrate;
an input transducer array disposed on the surface of said substrate, said array having a plurality of individual interdigital transducers connected electrically for the application of input signals, and spaced along an approximately circular arc having a transverse axis of symmetry, to provide acoustic radiation that is focused at a focal arc of greater than zero order, laterally spaced from said axis of symmetry, each position on the focal arc being representative of a different frequency component in the input signals;
an array of output transducers disposed on said substrate in such positions as to convert acoustic signals received at the focal arc into corresponding electrical output signals representative of relatively narrow frequency bands in the input signals; and
a plurality of acoustic waveguides leading from selected segments of the focal line to corresponding ones of said output transducers, whereby use of said waveguides provide for increased frequency resolution along the focal arc.

30. A surface acoustic wave device as set forth in claim 29, wherein:
said input transducers have interdigital fingers that are curved to improve their ability to function as point sources.

31. A surface acoustic wave device as set forth in claim 29, wherein:
said substrate material is practically isotropic and is of X-propagating lithium niobate produced with a Y-rotated cut at a rotation angle of approximately 121 degrees.

32. A surface acoustic wave device as set forth in claim 29, wherein:
said array of output transducers includes more than one transducer positioned to receive output signals from selected ones of said waveguides, for further improved frequency resolution.

33. A surface acoustic wave device as set forth in claim 32, wherein:
said input transducers have interdigital fingers that are curved to improve their ability to function as point sources.

34. A surface acoustic wave device as set forth in claim 32, wherein:
said substrate material is practically isotropic and is of X-propagating lithium niobate produced with a Y-rotated cut at a rotation angle of approximately 121 degrees.

35. A surface acoustic wave device as set forth in claim 29, wherein:
said substrate material is practically isotropic and is of X-propagating lithium niobate produced with a Y-rotated cut at a rotation angle of approximately 121 degrees.

36. A surface acoustic wave (SAW) device for use as a spectrum analyzer, said device comprising:
a piezoelectric substrate;
an input transducer array disposed on the surface of said substrate, said array having a plurality of individual interdigital transducers connected electrically for the application of input signals, and spaced along an approximately circular arc having a transverse axis of symmetry, to provide acoustic radiation that is focused at a focal arc of greater than zero order, laterally spaced from said axis of symmetry, each position on the focal arc being representative of a different frequency component in the input signals;
an array of output transducers disposed on said substrate in such positions as to convert acoustic signals received at the focal arc into corresponding electrical output signals representative of relatively narrow frequency bands in the input signals; and
a plurality of electromagnetic waveguides leading from said output transducers located on the focal line.

37. A surface acoustic wave device as set forth in claim 36, wherein:
said waveguides are hybrid stripline elements.

38. A surface acoustic wave device as set forth in claim 37, wherein:
said substrate material is practically isotropic and is of X-propagating lithium niobate produced with a Y-rotated cut at a rotation angle of approximately 121 degrees.

39. A surface acoustic wave device as set forth in claim 36, wherein:
said waveguides are dielectric waveguides.

40. A surface acoustic wave device as set forth in claim 39, wherein:
said substrate material is practically isotropic and is of X-propagating lithium niobate produced with a Y-rotated cut at a rotation angle of approximately 121 degrees.

41. A surface acoustic wave (SAW) device for use as a spectrum analyzer, said device comprising:
a piezoelectric substrate;
an input transducer array disposed on the surface of said substrate, said array having a plurality of individual interdigital transducers connected electrically for the application of input signals, and spaced along an approximately circular arc having a transverse axis of symmetry, to provide acoustic radiation that is focused onto a focal arc of greater than zero order, laterally spaced from said axis of symmetry, each position on the focal arc being representative of a different frequency component in the input signals; and
an output transducer array, disposed on said substrate in such positions as to convert acoustic signals received at the focal arc into corresponding electrical output signals representative of relatively narrow frequency bands in the input signals;
wherein said input transducers have interdigital fingers that are curved to improve their ability to function as point sources.

* * * * *